(12) United States Patent
Liang et al.

(10) Patent No.: US 10,247,993 B2
(45) Date of Patent: Apr. 2, 2019

(54) DISPLAY PANEL, DISPLAY DEVICE AND METHOD FOR REPAIRING DISCONNECTED LINE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Lisheng Liang, Beijing (CN); Lijun Xiao, Beijing (CN); Shuai Hou, Beijing (CN); Yih jen Hsu, Beijing (CN); Fei Shang, Beijing (CN); Hai jun Qiu, Beijing (CN); Bo Xu, Beijing (CN); Siqing Fu, Beijing (CN); Xianyong Gao, Beijing (CN); Shuai Chen, Beijing (CN)

(73) Assignees: BOE TECHNOLOGY GROUP CO., LTD., Beijing (CN); CHONGQING BOE OPTOELECTRONICS TECHNOLOGY CO, LTD., Chongqing (CA)

( * ) Notice: Subject to any disclaimer, the term of this patent is extended or adjusted under 35 U.S.C. 154(b) by 86 days.

(21) Appl. No.: 15/508,330

(22) PCT Filed: Aug. 26, 2016

(86) PCT No.: PCT/CN2016/096818
§ 371 (c)(1),
(2) Date: Mar. 2, 2017

(87) PCT Pub. No.: WO2017/118049
PCT Pub. Date: Jul. 13, 2017

(65) Prior Publication Data
US 2018/0239206 A1    Aug. 23, 2018

(30) Foreign Application Priority Data

Jan. 4, 2016 (CN) .......................... 2016 1 0006323

(51) Int. Cl.
*H03M 1/00* (2006.01)
*G02F 1/1362* (2006.01)
(Continued)

(52) U.S. Cl.
CPC ...... *G02F 1/136259* (2013.01); *G02F 1/1362* (2013.01); *G02F 1/136286* (2013.01);
(Continued)

(58) Field of Classification Search
CPC ......... G02F 1/136259; G02F 1/136286; H01L 27/124; H01L 21/76894
(Continued)

(56) References Cited

U.S. PATENT DOCUMENTS

2004/0070700 A1* 4/2004 Sah ....................... G02F 1/1309
349/54
2007/0109235 A1 5/2007 Hsu et al.
(Continued)

FOREIGN PATENT DOCUMENTS

CN        1740851 A      3/2006
CN      101334988 A     12/2008
(Continued)

OTHER PUBLICATIONS

The Second Chinese Office Action dated Jun. 29, 2017; Appln. No. 201610006323.0.
(Continued)

*Primary Examiner* — Lam T Mai
(74) *Attorney, Agent, or Firm* — Ladas & Parry LLP

(57) ABSTRACT

A display panel, a display device and a method for repairing a disconnected line. The display panel comprises a lower
(Continued)

substrate and a repair circuit. The lower substrate comprises data lines. The repair circuit comprises a proximal repair circuit, a distal repair circuit and an amplifier circuit. An input terminal of the amplifier circuit is electrically connect to a signal input terminal of a disconnected data line, and an output terminal of the amplifier circuit is electrically connect to a terminal of the proximal repair circuit and a terminal of the distal repair circuit respectively; another terminal of the proximal repair circuit is connect to a terminal of the disconnected data line that is close to the signal input terminal, and another terminal of the distal repair circuit is connect to a terminal of the disconnected data line that is away from the signal input terminal.

18 Claims, 6 Drawing Sheets

(51) Int. Cl.
  *H01L 21/768* (2006.01)
  *H01L 27/12* (2006.01)
  *H01L 27/32* (2006.01)
(52) U.S. Cl.
  CPC ...... *H01L 21/76894* (2013.01); *H01L 27/124* (2013.01); *G02F 2001/136263* (2013.01); *G02F 2001/136272* (2013.01); *G02F 2001/136295* (2013.01); *H01L 27/3276* (2013.01); *H01L 2251/568* (2013.01)
(58) Field of Classification Search
  USPC .......................................................... 341/140
  See application file for complete search history.

(56) References Cited

U.S. PATENT DOCUMENTS

| | | | |
|---|---|---|---|
| 2010/0265424 A1* | 10/2010 | Chiu | G02F 1/136259 349/54 |
| 2010/0284541 A1* | 11/2010 | Taira | H03G 3/3052 381/1 |
| 2010/0294541 A1* | 11/2010 | Funahashi | G02F 1/136259 174/250 |
| 2011/0310343 A1 | 12/2011 | Ueda et al. | |
| 2012/0147311 A1 | 6/2012 | Chen et al. | |
| 2014/0168594 A1* | 6/2014 | Deng | G02F 1/136259 349/150 |
| 2017/0185223 A1* | 6/2017 | Lu | G06F 3/0412 |

FOREIGN PATENT DOCUMENTS

| | | |
|---|---|---|
| CN | 102073159 A | 5/2011 |
| CN | 102301408 A | 12/2011 |
| CN | 105607367 A | 5/2016 |

OTHER PUBLICATIONS

International Search Report and Written Opinion dated Oct. 27, 2016; PCT/CN2016/096818.
First Chinese Office Action dated Jan. 10, 2017; Appln. No. 201610006323.0.

\* cited by examiner

DISPLAY PANEL, DISPLAY DEVICE AND METHOD FOR REPAIRING DISCONNECTED LINE

TECHNICAL FIELD

Embodiments of the present disclosure relates to a display panel, a display device and a method for repairing a disconnected line.

BACKGROUND

TFT LCDs (Thin Film Transistor Liquid Crystal Display) have advantages such as good performance, good property of mass production and wide development space, and become mainstream products in the field of displays nowadays. In the manufacturing process of a TFT LCD, data lines of the liquid crystal display panel may be broken, and thus the quality of the LCD is seriously influenced. In order to solve the problem of disconnection, the broken data line is usually repaired. However, the existing method to repair the disconnected data line usually causes two terminals of the disconnected data line being repaired to have different driving abilities, and then causes uneven luminance of the liquid display panel.

SUMMARY

In a first aspect, an embodiment of the present disclosure provides a display panel. The display panel comprises: a lower substrate comprising data lines; and a repair circuit comprising a proximal repair circuit, a distal repair circuit and an amplifier circuit. An input terminal of the amplifier circuit is configured to electrically connect to a signal input terminal of a disconnected data line, and an output terminal of the amplifier circuit is configured to electrically connect to a terminal of the proximal repair circuit and a terminal of the distal repair circuit respectively; another terminal of the proximal repair circuit is configured to connect to a terminal of the disconnected data line that is close to the signal input terminal of the disconnected data line; and another terminal of the distal repair circuit is configured to connect to a terminal of the disconnected data line that is away from the signal input terminal of the disconnected data line.

In an implementation of the embodiment of the disclosure, for example, the lower substrate comprises: an effective display area and a peripheral wiring area; the data lines are disposed in the effective display area and extend to the peripheral wiring area; and the repair circuit is disposed in the peripheral wiring area.

In another implementation of the embodiment of the disclosure, for example, the amplifier circuit comprises an operational amplifier, a first repair line and a first trace line; the proximal repair circuit comprises a second repair line and a second trace line; the distal repair circuit comprises a third trace line; the data lines are intercrossed with and insulated from the first repair line and the second repair line; a terminal of the first trace line is connected to an input terminal of the operational amplifier, and another terminal of the first trace line is disposed close to the first repair line; a terminal of the second trace line is connected to an output terminal of the operational amplifier, and another terminal of the second trace line is disposed close to the second repair line; a terminal of the third trace line is connected to the output terminal of the operational amplifier, and another terminal of the third trace line is disposed close to terminals of all the data lines that are away from the signal input terminals of all the data lines.

In another implementation of the embodiment of the disclosure, for example, an insulating layer is disposed between a layer where the data lines are disposed and a layer where the first repair line is disposed.

In another implementation of the embodiment of the disclosure, for example, the first trace line, the second trace line and the third trace line are disposed in a same layer.

In another implementation of the embodiment of the disclosure, for example, the first repair line and the second repair line are disposed in parallel with each other; the first repair line and the second repair line are disposed perpendicular to the data lines.

In another implementation of the embodiment of the disclosure, for example, a length of the first repair line is equal to a length of the second repair line.

In another implementation of the embodiment of the disclosure, for example, the second trace line and the third trace line extend through a side near a same terminal of the first repair line.

In another implementation of the embodiment of the disclosure, for example, when the display panel comprises at least two repair circuits, the first trace line, the second trace line and the third trace line in each repair circuit form a trace-line group, and trace lines in a same trace-line group are disposed in a same layer, trace lines in different trace-line groups are disposed in different layers.

In another implementation of the embodiment of the disclosure, for example, when the data lines comprise a disconnected data line, the disconnected data line is cut off at a location between the first repair line and the second repair line; another terminal of the first trace line is connected to the first repair line; another terminal of the second trace line is connected to the second repair line; another terminal of the third trace line is connected to a terminal of the disconnected data line that is away from the signal input terminal; the first repair line is connected to the disconnected data line, and the second repair line is connected to the disconnected data line.

In another implementation of the embodiment of the disclosure, for example, the first repair line and the second repair line are formed from at least one material of molybdenum, molybdenum-niobium alloy, aluminum, aluminum-neodymium alloy, titanium and copper.

In a second aspect, an embodiment of the disclosure provides a display device, comprising the display panel in the first aspect or any implementation in the first aspect.

In a third aspect, an embodiment of the disclosure provides a method for repairing a disconnected line of the display panel described above, comprising: cutting off a signal input terminal of a disconnected data line; electrically connecting the input terminal of the amplifier circuit to the signal input terminal of the disconnected data line; electrically connecting another terminal of the proximal repair circuit to a terminal of the disconnected data line that is close to the signal input terminal of the disconnected data line; electrically connecting another terminal of the distal repair circuit to a terminal of the disconnected data line that is away from the signal input terminal.

In an implementation of the embodiment of the disclosure, for example, the amplifier circuit comprises an operational amplifier, a first repair line and a first trace line; the proximal repair circuit comprises a second repair line and a second trace line; the distal repair circuit comprises a third trace line; the data lines are intercrossed with and insulated from the first repair line and the second repair line; a terminal of the first trace line is connected to an input terminal of the operational amplifier, and another terminal of the first trace line is disposed close to the first repair line; a terminal of the second trace line is connected to an output terminal of the operational amplifier, and another terminal of the second trace line is disposed close to the second repair line; a terminal of the third trace line is connected to the output terminal of the operational amplifier, and another terminal of the third trace line is disposed close to terminals of all the data lines that are away from the signal input terminals of all the data lines.

In another implementation of the embodiment of the disclosure, for example, the disconnected data line is cut off through a laser cutting process at a cutting location located between the first repair line and the second repair line; connecting the other terminal of the first trace line to the first repair line through a laser welding process; connecting the other terminal of the second trace line to the second repair line; connecting the other terminal of the third trace line to a terminal of the disconnected data line that is away from the signal input terminal of the disconnected data line; connecting the first repair line to the disconnected data line; connecting the second repair line to the disconnected data line.

In another implementation of the embodiment of the disclosure, for example, the method further comprises: cutting off the first repair line through the laser cutting process, wherein a cutting location of the first repair line is located between the disconnected data line and a data line adjacent to the disconnected data line, and is located on a side of a junction of the disconnected data line and the first repair line that is farther away from the first trace line.

In another implementation of the embodiment of the disclosure, for example, the method further comprises: cutting off the second repair line through the laser cutting process, wherein a cutting location of the second repair line is located between the disconnected data line and a data line adjacent to the disconnected data line, and is located on a side of a junction of the disconnected data line and the second repair line that is farther away from the second trace line.

In another implementation of the embodiment of the disclosure, for example, the disconnected data line is cut off by a laser repair device.

In another implementation of the embodiment of the disclosure, for example, the other terminal of the first trace line and the first repair line are connected by a laser repair device.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
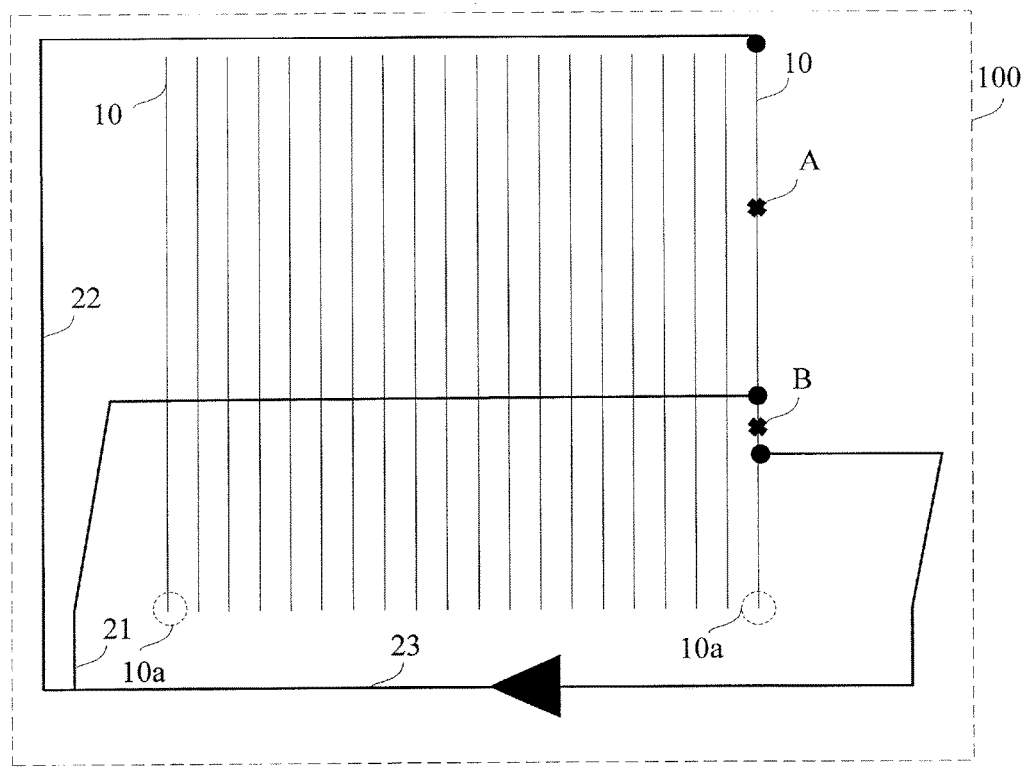
FIG. 1 is a structural schematic view of a display panel according to an embodiment of the present disclosure.

FIG. 1 is a structural schematic view of a display panel according to an embodiment of the present disclosure. Referring to FIG. 1, a display panel comprises a lower substrate 100. The lower substrate 100 comprises data lines 10. As shown in the figure, a plurality of data lines 10 extend in parallel with each other. The lower substrate 100 can further comprises a plurality of gate lines extending in parallel with each other (not shown in the figure). These gate lines and the data lines are intercrossed to define an array of pixel units.

The display panel further comprises a repair circuit. The repair circuit comprises a proximal repair circuit 21, a distal repair circuit 22 and an amplifier circuit 23. An input terminal of the amplifier circuit 23 is used for connecting to a signal input terminal 10a of a disconnected data line 10. An output terminal of the amplifier circuit 23 is electrically connected to a terminal of the proximal repair circuit 21 and a terminal of the distal repair circuit 22 respectively. Another terminal of the proximal repair circuit 21 is used for connecting to a terminal of the disconnected data line 10 that is close to the signal input terminal 10a. Another terminal of the distal repair circuit 22 is used for connecting to a terminal of the disconnected data line 10 that is away from the signal input terminal 10a. The amplifier circuit 23 is used for amplifying a signal provided by a source driving IC (Integrated Circuit) to ensure the signal to have enough energy to pass through the proximal repair circuit 21 or the distal repair circuit 22 and reach the data lines 10.

In FIG. 1, a point A represents a disconnected point of the data line. When the data line is disconnected, welding is performed at three circular dots respectively to connect the proximal repair circuit 21, the distal repair circuit 22 and the amplifier circuit 23 to the data line. Meanwhile, a cutting off may be performed at a point B to prevent the signal input terminal of the data line from transmitting a driving signal to the disconnected data line directly.

In an embodiment of the present disclosure, when the data line 10 is disconnected at the point A, the input terminal of the amplifier circuit 23 is electrically connected to the signal input terminal 10a of the data line 10; the output terminal of the amplifier circuit 23 is electrically connected to a terminal of the proximal repair circuit 21 and a terminal of the distal repair circuit 22 respectively; the other terminal of the proximal repair circuit 21 is electrically connected to the near terminal of the disconnected data line; and the other terminal of the distal repair circuit 22 is electrically connected to the far terminal of the disconnected data line. Therefore, in the embodiment of the present disclosure, driving signals provided for the near terminal and the far terminal of the disconnected data line both pass through the amplifier circuit 23, and the driving capabilities of the two signals are similar. Thus, uneven display caused by a conventional repair method used for repairing a large-size liquid crystal panel can be alleviated, and the display quality is improved.

Figure 2:
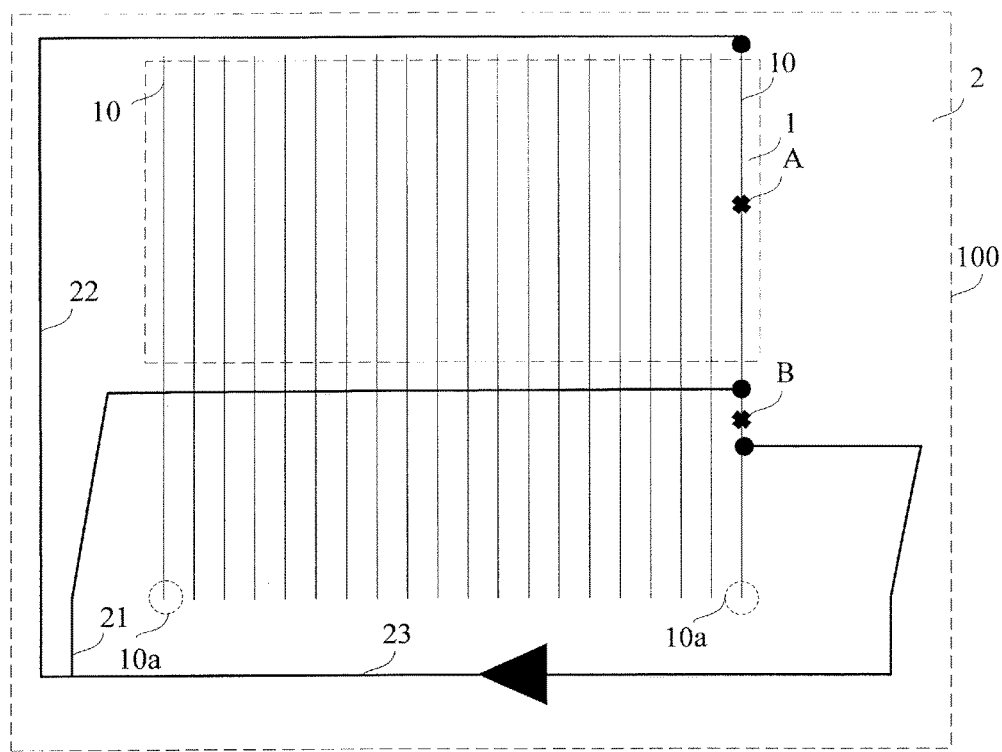
FIG. 2 is another structural schematic view of a display panel according to an embodiment of the present disclosure.

FIG. 2 is another structural schematic view of a display panel according to an embodiment of the present disclosure. Referring to FIG. 2, the display panel comprises a lower substrate 100. The lower substrate 100 comprises an effective display area 1 and a peripheral wiring area 2. The effective display area 1 is disposed in a center area (for example, including a pixel area) of the display panel. The peripheral wiring area 2 is disposed around the effective display area 1.

A source driving IC (not shown in the figure) is disposed in the peripheral wiring area 2. Data lines 10 are disposed in the effective display area 1 and the data lines 10 extend to the peripheral wiring area 2. The source driving IC is connected to the signal input terminals 10a of the data lines 10. It can be seen from the FIG. 2, multiple data lines 10 are disposed in parallel with each other, and each data line 10 extends from the effective display area 1 to the peripheral wiring area 2.

A repair circuit is also disposed in the peripheral wiring area 2. The repair circuit comprises a proximal repair circuit 21, a distal repair circuit 22 and an amplifier circuit 23. An input terminal of the amplifier circuit 23 is used for connecting to a signal input terminal 10a of the disconnected data line 10. An output terminal of the amplifier circuit 23 is electrically connected to a terminal of the proximal repair circuit 21 and a terminal of the distal repair circuit 22 respectively. Another terminal of the proximal repair circuit 21 is used for connecting to a terminal of the disconnected data line 10 that is close to the signal input terminal 10a. Another terminal of the distal repair circuit 22 is used to connecting to a terminal of the disconnected data line 10 that is away from the signal input terminal 10a. The amplifier circuit 23 is used for amplifying a signal provided by a source driving IC to ensure the signal to have enough energy to pass through the proximal repair circuit 21 or the distal repair circuit 22 and reach the data line 10.

In FIG. 2, a point A represents a disconnected point of the data line. When the data line is broken, welding is performed at three circular dots respectively to connect the proximal repair circuit 21, the distal repair circuit 22 and the amplifier circuit 23 to the data line. Meanwhile, a cutting off may be configured at a point B to prevent the signal input terminal of the data line from transmitting a driving signal to the disconnected data line directly.

In an embodiment of the present disclosure, when the data line 10 is disconnected at the point A, the input terminal of the amplifier circuit 23 is electrically connected to the signal input terminal 10a of the data line 10; the output terminal of the amplifier circuit 23 is electrically connected to a terminal of the proximal repair circuit 21 and a terminal of the distal repair circuit 22 respectively; the other terminal of the proximal repair circuit 21 is electrically connected to the near terminal of the disconnected data line; and the other terminal of the distal repair circuit 22 is electrically connected to the far terminal of the disconnected data line. Therefore, in the embodiment of the present disclosure, driving signals provided for the near terminal and the far terminal of the disconnected data line both pass through the amplifier circuit 23, and the driving capabilities of the two signals are similar. Thus, the uneven display caused by the conventional repair method used for repairing a large-size liquid crystal panel can be alleviated, and the display quality is improved.

Figure 3:
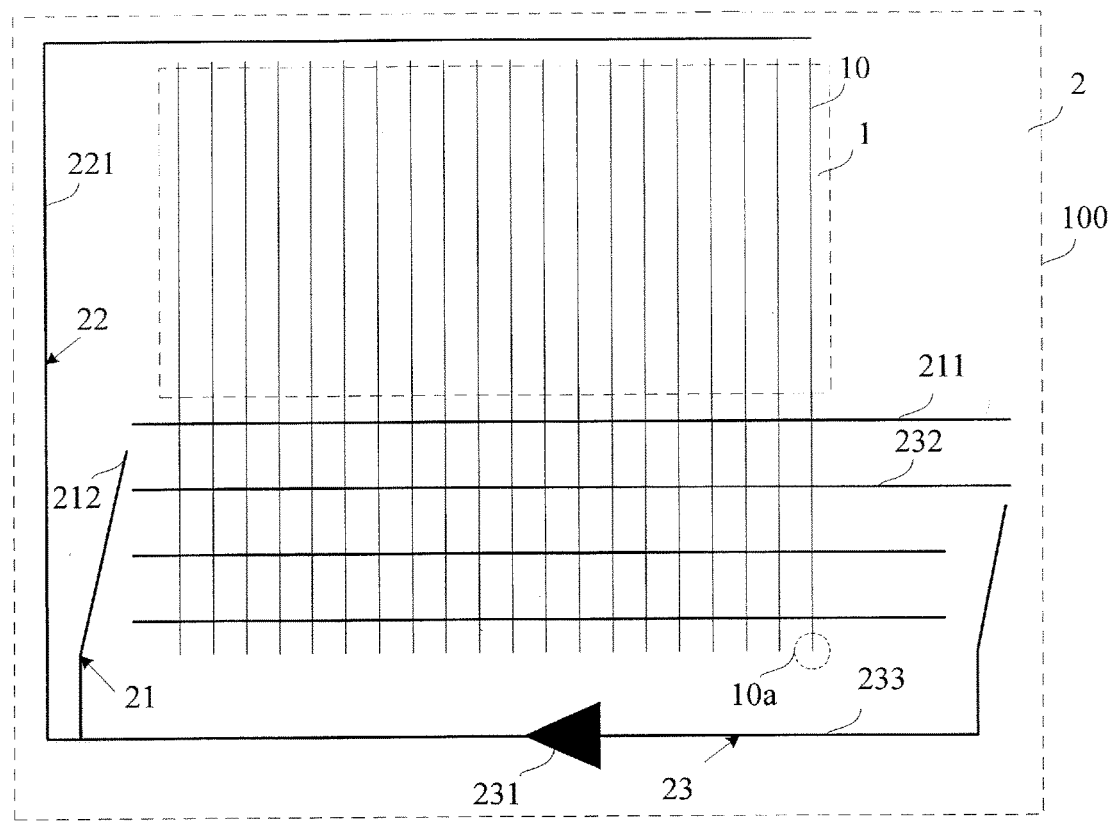
FIG. 3 is another structural schematic view of a display panel according to an embodiment of the present disclosure.

FIG. 3 is another structural schematic view of a display panel according to an embodiment of the present disclosure. The structure provided by FIG. 3 is similar to that of FIG. 2, and a main difference includes an example of the proximal repair circuit 21, the distal repair circuit 22 and the amplifier circuit 23 is shown in FIG. 3.

As shown in FIG. 3, the amplifier circuit 23 comprises an operational amplifier (OP) 231, a first repair line 232 and a first trace line 233. The proximal repair circuit 21 comprises a second repair line 211 and a second trace line 212. The distal repair circuit 22 comprises a third trace line 221. The data lines 10 are intercrossed with and insulated from the first repair line 232 and the second repair line 211.

A terminal of the first trace line 233 is connected to an input terminal of the operational amplifier 231, and another terminal of the first trace line 233 is disposed close to the first repair line 232. A terminal of the second trace line 212 is connected to an output terminal of the operational amplifier 231, and another terminal of the second trace line 212 is disposed closed to the second repair line 211. A terminal of the third trace line 221 is connected to an output terminal of the operational amplifier 231, and another terminal of the third trace line 221 is disposed close to the terminals of the data lines 10 that are away from the signal input terminals 10a.

In order to dispose the other terminal of the first trace line 233 to be close to the first repair line 232, the first trace line 233 can be disposed directly above or below the first repair line 232; or, the first trace line 233 is disposed obliquely above or below the first repair line 232, and a distance between the projections of the two on the display panel is less than a certain range which can ensure that the two can be welded together in a subsequent welding process; or, the first trace line 233 and the first repair line 232 are disposed in a same layer, and the distance between the two is less than a range which can ensure that the two can be welded together in the subsequent welding process.

In order to dispose the other terminal of the second trace line 212 to be close to the second repair line 211, the second trace line 212 is disposed directly above or below the second repair line 211; or, the second trace line 212 is disposed obliquely above or below the second repair line 211, and a distance between the projections of the two on the display panel is less than a certain range; or the second trace line 212 and the second repair line 211 are disposed in a same layer, and the distance between the two is less than a certain range.

In order to dispose the other terminal of the third trace line 221 to be close to a terminal of the data line 10 that is away from the signal input terminal 10a, the third trace line 221 is disposed directly above or below the terminal of the data line 10 that is away from the signal input terminal 10a; or, the third trace line 221 is disposed obliquely above or below the terminal of the data line 10 that is away from the signal input terminal 10a, and a distance between the projections of the two on the display panel is less than a certain range; or the third trace line 221 and the terminal of the data line 10 that is away from the signal input terminal 10a are disposed in a same layer, and the distance between the two is less than a certain range.

According to the description above, the trace lines (the first trace line 233, the second trace line 212 and the third trace line 221) and the repair lines (the first repair line 232 and the second repair line 221) mentioned above can be disposed in different layers of the lower substrate. For example, the trace lines and the gate lines can be disposed in a same layer; or, the trace lines and the data lines can be disposed in a same layer. The repair lines and the data lines can be disposed in a same layer, or the repair lines can be disposed in a layer above the data lines. When the trace lines and the gate lines are disposed in different layers, in order to connect the trace lines and the OP (which is disposed in a same layer with the gate lines) disposed on the substrate, via holes can be drilled through layers that are between the trace lines and the OP for connecting the trace lines to the OP.

When a line disconnection occurs in a panel, in a conventional repair method, two terminals of the disconnected data line and two repair lines which are perpendicular to the data line are welded together respectively; and then the two repair lines which are perpendicular to the data line are connected together by a repair line disposed outside the display area in order to connect the two terminals of the disconnected data line; and then the signal can be transmitted. By applying this repair method, the disconnected data line in the panel can be connected, but for the data line, the signal of the terminal close to the signal input terminal of the data line is directly provided by the source driving IC while the signal of the terminal away from the signal input terminal is an output signal of the source IC after passing through the repair lines and the OP connected between the repair lines. The driving capabilities of the driving signals provided by the source driving IC and the OP are different, which causes the uneven luminance of the display panel ultimately.

In the embodiments of the present disclosure, a portion of the disconnected data line in the peripheral wiring area is cut off from a portion of the disconnected data line in the display area; a terminal of the first repair line and the data line in the peripheral wiring area are connected; the other terminal of the first repair line and the OP are connected by the first trace line. The signal from OP is transmitted to the near terminal and the far terminal of the disconnected data line through the second trace line and the third trace line respectively to realize the repair of the disconnected line in the liquid crystal display panel. In this method, for the near terminal and the far terminal of the disconnected data line, the driving capabilities of signals are determined by the OP, and the driving capabilities are similar. Besides, a distance passed by the signal that reaches the far terminal and a distance passed by the signal that reaches the near terminal are similar, and thus the resistances are similar. Therefore, the uneven display caused by the conventional repair method used for repairing a large-size liquid crystal panel can be alleviated, and the display quality is improved.

In the embodiments of the present disclosure, an insulating layer is disposed between a layer where the data lines 10 are disposed and a layer where the first repair line 232 is disposed. The insulating layer is used for preventing shortage between the data lines and the repair lines and ensuring the normal operations of the repair lines.

For example, the first trace line 233, the second trace line 212 and the third trace line 221 are disposed in a same layer with the gate lines of the lower substrate. In one hand, disposing the trace lines in a same layer with the gate lines can achieve manufacture of the trace lines when the gate lines are manufactured; in the other hand, there is no need to manufacture via holes for connecting the trace lines to the OP, and the manufacturing process is simplified.

Referring to FIG. 3 again, the first repair line 232 and the second repair line 211 are disposed in parallel with each other. The first repair line 232 and the second repair line 211 are disposed perpendicular to the data line 10. The repair lines are disposed in parallel with each other to prevent shortage between the repair lines, and thus the normal operation can be ensured. The repair lines are disposed perpendicular to the data lines, which is convenient for designing and processing.

In the embodiments of the present disclosure, for example, the length of the first repair line 232 can be equal to the length of the second repair line 211, which is convenient for designing and processing.

In the embodiments of the present disclosure, the amounts of the first repair lines 232 and the second repair lines 211 can be set according to the practical demands. At least one first repair line 232 and at least one second repair line 211 can be set. When one data line is disconnected, one first repair line 232 and one second repair line 211 are needed to be used; when a plurality of data lines are disconnected, a plurality of first repair lines 232 and a plurality of second repair lines 211 are needed to be used. Correspondingly, in order to repair a plurality of disconnected lines, a plurality of OPs, a plurality of first trace lines 233, a plurality of second trace lines 212 and a plurality of third trace lines 221 can be disposed.

When the display panel comprises at least two repair circuits, the first trace line 233, the second trace line 212 and the third trace line 221 in each repair circuit form a trace-line group, and trace lines in a same trace-line group are disposed in a same layer, trace lines in different trace-line groups are disposed in different layers. One trace-line group can be used for repairing a disconnected point of a data line. This configuration can prevent intersection of trace lines in different trace-line groups.

Referring to FIG. 3 again, the second trace line 212 and the third trace line 221 extend through a side that is near to a same terminal of the first repair line 232. This configuration can ensure the current to flow in a same direction, thereby reducing interference, and ensuring the distance passed by the signal that reaches the far terminal and the distance passed by the signal that reaches the near terminal are similar to reduce the difference of resistances.

In the embodiments of the present disclosure, the first trace line 233, the second trace line 212 and the third trace line 221 can be fold lines, straight lines, or curve lines. They also can be formed by a plurality of lines connected together.

Figure 4:
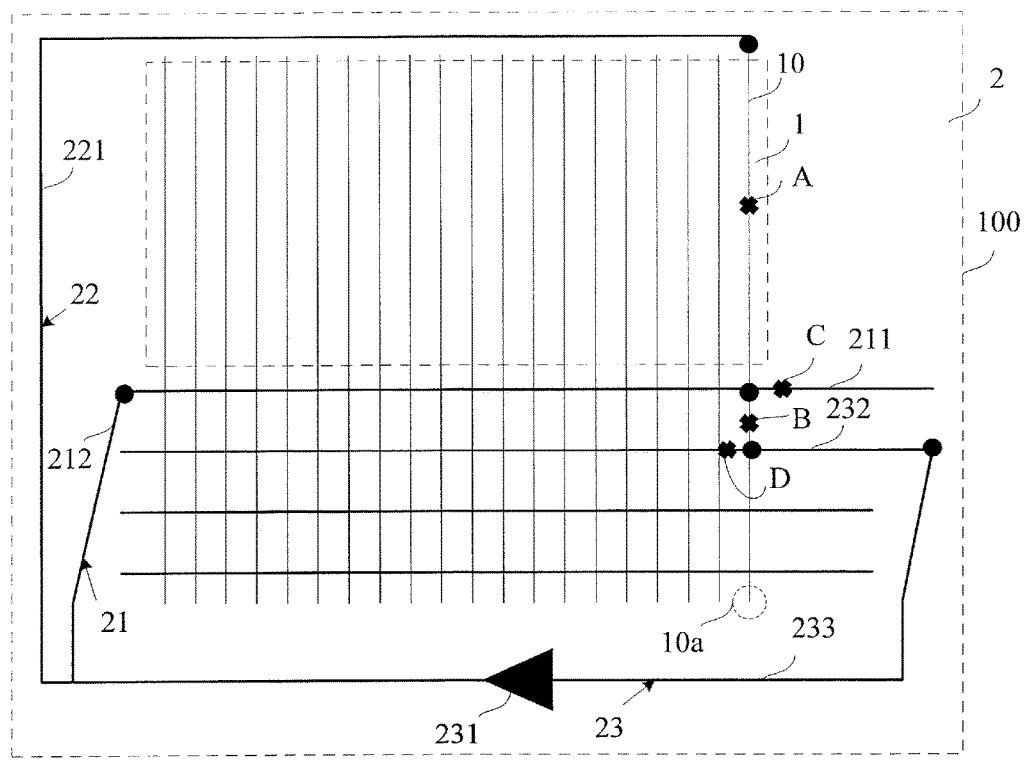
FIG. 4 is another structural schematic view of a display panel according to an embodiment of the present disclosure.

FIG. 4 is another structural schematic view of a display panel according to an embodiment of the present disclosure. The structure shown in FIG. 4 is a structure that is repaired when the data line 10 is broken at a point A, where the proximal repair circuit 21, the distal repair circuit 22 and the amplifier circuit 23 are connected to the data line to repair the data line. The detail is described as follows.

The data line 10 is interrupted at a location between the first repair line 232 and the second repair line 211, i.e., at the location of a point B. The other terminal of the first trace line 233 is connected to the first repair line 232. The other terminal of the second trace line 212 is connected to the second repair line 211. The other terminal of the third trace line 221 is connected to a terminal of the disconnected data line 10 that is away from the signal input terminal 10a. The first repair line 232 is connected to the disconnected data line 10. The second repair line 211 is connected to the disconnected data line 10. The detail locations are shown as points in the figure.

Furthermore, each of the first repair line 232 and the second repair line 211 are cut off, respectively. For example, a cutting-off location of the first repair line 232 is disposed between the disconnected data line 10 and another data line 10 that is adjacent to the disconnected data line 10, and is located on a side of a junction of the disconnected data line 10 and the first repair line 232, where the side of the junction of the disconnected data line 10 and the first repair line 232 is farther away from the first trace line 233 (point D in FIG. 4). Thus, the portion of the first repair line 232 that is not connected to the circuit is cut off to prevent shortage between the portion of the first repair line 232 that is not connected to the circuit and other signal lines when a process failure occurs.

For example, a cutting-off location of the second repair line 211 is located between the disconnected data line 10 and another data line 10 that is adjacent to the disconnected data line 10, and is located on a side of a junction of the disconnected data line 10 and the second repair line 211, where the side of the junction of the disconnected data line 10 and the second repair line 211 is farther away from the second trace line 212 (point C in FIG. 4). Thus, the portion of the second repair line 211 that is not connected to the circuit is cut off to prevent shortage between the portion of the second repair line 211 that is not connected to the circuit and other signal lines when a process failure occurs.

In the implementation mentioned above, when the data line is disconnected, the repair lines, the trace lines and the data line are connected through laser cutting and welding to realize the normal display, and the display uniformity is ensured.

In the display panel according to FIGS. 1-4, the first repair line 232 and the second repair line 211 can be formed by at least one material of molybdenum, molybdenum-niobium alloy, aluminum, aluminum-neodymium alloy, titanium and copper.

In the embodiments of the present disclosure, the lower substrate can be an array substrate. The array substrate comprises a plurality of gate lines and a plurality of data lines. The gate lines and the data lines are intersected with each other to define the pixel units arranged as a matrix.

Embodiments of the present disclosure further provide a display device. The display device comprises the display panel according to ally one of FIGS. 1-4. The display device can be a display device, an organic light-emitting display device, an electronic paper display device and the like.

For example, the liquid crystal display device comprises an array substrate and an opposite substrate which are disposed opposite to each other to form a liquid crystal cell. Liquid crystal material is filled in the liquid crystal cell. The opposite substrate, for instance, is a color filter substrate. In some examples, the liquid crystal display device further comprises a back light source for providing back light for the array substrate.

For example, stacks of organic light-emitting materials are formed on an array substrate of an organic light-emitting diode display device (OLED), and are separated from outside by a sealing layer or a cover plate.

For example, an electronic ink layer is formed on an array substrate of an electronic paper display device. A sealing layer or a cover plate is formed on the electronic ink layer to separate the electronic ink layer from outside.

In the embodiments of the present disclosure, the output terminal of the amplifier circuit is electrically connected to a terminal of the proximal repair circuit and a terminal of the distal repair circuit respectively; when the data line is disconnected, the input terminal of the amplifier circuit is electrically connected to the source driving IC through the signal input terminal of the data line; the other terminal of the proximal repair circuit is electrically connected to the near terminal of the disconnected data line; the other end of the distal repair circuit is electrically connected to the far terminal of the disconnected data line. The driving signals provided for the near terminal and the far terminal of the disconnected data line both pass through the amplifier circuit, and the driving capabilities of the two signals are similar. Thus, the uneven display caused by the conventional repair method used for repairing a large-size liquid crystal panel can be alleviated, and the display quality is improved.

Figure 5:
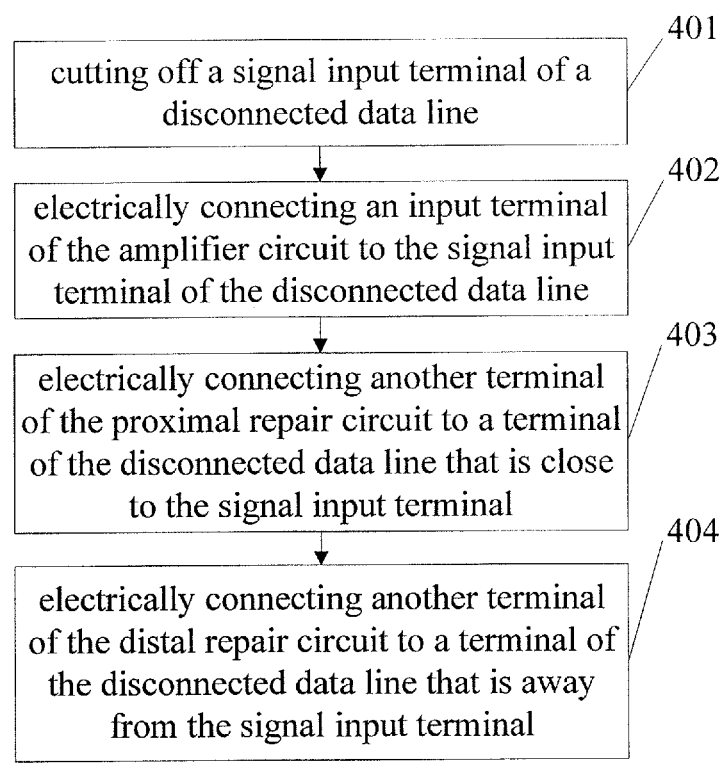
FIG. 5 is a flow diagram of a method for repairing a disconnected line of a display panel according to an embodiment of the present disclosure.

FIG. 5 is a flow diagram of a method for repairing a disconnected line of a display panel according to an embodiment of the present disclosure. This method can be implemented based on the display panel according to FIG. 1. Referring to FIG. 5, the method comprises the following operations:

Step 401: cutting off a signal input terminal of a disconnected data line from the disconnected data line.

This step can prevent the signal input terminal from directly supplying power to the disconnected data line.

Step 402: electrically connecting an input terminal of the amplifier circuit to the signal input terminal of the disconnected data line.

Step 403: electrically connecting the other terminal of the proximal repair circuit to a terminal of the disconnected data line close to the signal input terminal.

Step 404: electrically connecting the other terminal of the distal repair circuit to a terminal of the disconnected data line away from the signal input terminal.

A terminal of the proximal repair circuit and a terminal of the distal repair circuit are electrically connected to the amplifier circuit directly. Therefore, the repair of the disconnected line can be realized by connections of the other terminals of the proximal repair circuit and the distal repair circuit.

In the embodiments of the present disclosure, when the data line is disconnected, the input terminal of the amplifier circuit is electrically connected to the source driving IC through the signal input terminal of the data line; the output terminal of the amplifier circuit is electrically connected to a terminal of the proximal repair circuit and a terminal of the distal repair circuit respectively; the other terminal of the proximal repair circuit is electrically connected to the near terminal of the disconnected data line; the other end of the distal repair circuit is electrically connected to the far terminal of the disconnected data line. Thus, in this technical solution, the driving signals provided for the near terminal and the far terminal of the disconnected data line both pass through the amplifier circuit, and the driving capabilities of the two signals are similar. Thus, the uneven display caused by the conventional repair method used for repairing a large-size liquid crystal panel can be alleviated, and the display quality is improved.

Figure 6:
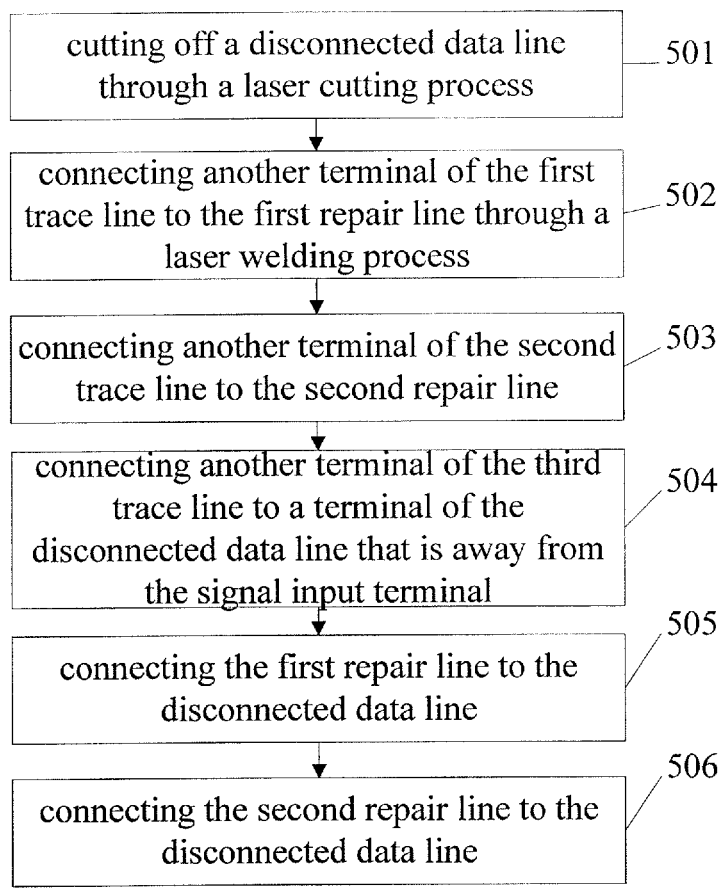
FIG. 6 is another flow diagram of a method for repairing a disconnected line of a display panel according to an embodiment of the present disclosure.

FIG. 6 is another flow diagram of a method for repairing a disconnected line of a display panel according to an embodiment of the present disclosure. This method can be implemented based on the display panel according to any one of FIG. 2, FIG. 3 and FIG. 4. Referring to FIG. 6, the method comprises the following operations:

Step 501: cutting off a disconnected data line through a laser cutting process at a cutting location located between the first repair line and the second repair line, as shown as the point B in FIG. 4.

When the disconnected data line is cut off through the laser cutting process, for example, a laser repair device can be used to cut the disconnected data line.

Step 502: connecting the other terminal of the first trace line to the first repair line through a laser welding process.

When connecting the other terminal of the first trace line to the first repair line through the laser welding process, the laser repair device can be used to connect the other end of the first trace line to the first repair line.

Step 503: connecting the other terminal of the second trace line to the second repair line.

For example, the other terminal of the second trace line and the second repair line are connected through a laser welding process.

Step 504: connecting the other terminal of the third trace line to a terminal of the disconnected data line that is away from the signal input terminal.

For example, the other terminal of the third trace line and the terminal of the disconnected data line that is away from the signal input terminal are connected through a laser welding process.

Step 505: connecting the first repair line to the disconnected data line.

For example, the first repair line and the disconnected data line are connected through a laser welding process.

Step 506: connecting the second repair line to the disconnected data line.

For example, the second repair line and the disconnected data line are connected through a laser welding process.

When data line breakage occurs in the panel, a portion of a disconnected data line in the peripheral wiring area is cut off from a portion of the disconnected data line in the display area; a terminal of the first repair line and the portion of the disconnected data line in the peripheral wiring area are connected; the other terminal of the first repair line and the OP of a PCB are connected by the first trace line. The signal outputted from the OP is transmitted to the near terminal and the far terminal of the disconnected data line through the second trace line and the third trace line respectively to achieve the repair of the disconnected data line in the liquid crystal display panel. In this method, for the near terminal and the far terminal of the disconnected data line, the driving capabilities of signals are determined by the OP, and the driving capabilities are similar. Besides, a distance passed by a signal that reaches the far terminal and a distance passed by a signal that reaches the near terminal are similar, and thus the resistances are similar. Therefore, the uneven display caused by the conventional repair method used for repairing a large-size liquid crystal panel can be alleviated, and the display quality is improved.

Furthermore, for example, the method can further comprises: cutting off the first repair line through the laser cutting process, and the cutting location of the first repair line is located between the disconnected data line and a data line adjacent to the disconnected data line (point D in FIG. 4), and is located on a side of a junction of the disconnected data line and the first repair line, where the side of the junction of the disconnected data line and the first repair line is farther away from the first trace line. Thus, a portion of the first repair line that is not connected to the circuit is cut off.

Furthermore, for example, the method can further comprises: cutting off the second repair line through the laser cutting process, and the cutting location of the second repair line is located between the disconnected data line and a data line adjacent to the disconnected data line (point C in FIG. 4), and is located on a side of a junction of the disconnected data line and the second repair line, where the side of the junction of the disconnected data line and the second repair line is farther away from the second trace line. Thus, a portion of the second repair line that is not connected to the circuit is cut off.

What are described above is related to the illustrative embodiments of the disclosure only and not limitative to the scope of the disclosure; any amendment, equivalent replacement, improvement and the like within the spirit and principles of the present invention should be within the scope of the invention.

The present application claims the priority of the Chinese Patent Application No. 201610006323.0 filed on Jan. 4, 2016, which is incorporated herein in its entirety by reference as part of the disclosure of the present application.

What is claimed is:

1. A display panel, comprising:
a lower substrate comprising data lines;
a repair circuit comprising a proximal repair circuit, a distal repair circuit and an amplifier circuit;
wherein an input terminal of the amplifier circuit is configured to electrically connect to a signal input terminal of a disconnected data line, and an output terminal of the amplifier circuit is configured to electrically connect to a terminal of the proximal repair circuit and a terminal of the distal repair circuit respectively;
another terminal of the proximal repair circuit is configured to connect to a terminal of the disconnected data line that is close to the signal input terminal of the disconnected data line; and
another terminal of the distal repair circuit is configured to connect to a terminal of the disconnected data line that is away from the signal input terminal of the disconnected data line;
wherein the amplifier circuit comprises an operational amplifier, a first repair line and a first trace line;
the proximal repair circuit comprises a second repair line and a second trace line;
the distal repair circuit comprises a third trace line;
the data lines are intercrossed with and insulated from the first repair line and the second repair line;
a terminal of the first trace line is connected to an input terminal of the operational amplifier, and another terminal of the first trace line is disposed close to the first repair line;
a terminal of the second trace line is connected to an output terminal of the operational amplifier, and another terminal of the second trace line is disposed close to the second repair line;
a terminal of the third trace line is connected to the output terminal of the operational amplifier, and another terminal of the third trace line is disposed close to terminals of all the data lines that are away from the signal input terminals of all the data lines.

2. The display panel according to claim 1, wherein an insulating layer is disposed between a layer where the data lines are disposed and a layer where the first repair line is disposed.

3. The display panel according to claim 2, wherein the first trace line, the second trace line and the third trace line are disposed in a same layer.

4. The display panel according to claim 2, wherein the first repair line and the second repair line are disposed in parallel with each other; the first repair line and the second repair line are disposed perpendicular to the data lines.

5. The display panel according to claim 4, wherein a length of the first repair line is equal to a length of the second repair line.

6. The display panel according to claim 1, wherein the second trace line and the third trace line extend through a side near a same terminal of the first repair line.

7. The display panel according to claim 1, wherein when the display panel comprises at least two repair circuits, the first trace line, the second trace line and the third trace line in each repair circuit form a trace-line group, and trace lines in a same trace-line group are disposed in a same layer, trace lines in different trace-line groups are disposed in different layers.

8. The display panel according to claim 1, wherein when the data lines comprise a disconnected data line,
the disconnected data line is cut off at a location between the first repair line and the second repair line;
another terminal of the first trace line is connected to the first repair line;
another terminal of the second trace line is connected to the second repair line;
another terminal of the third trace line is connected to a terminal of the disconnected data line that is away from the signal input terminal;
the first repair line is connected to the disconnected data line, and the second repair line is connected to the disconnected data line.

9. The display panel according to claim 1, wherein the first repair line and the second repair line are formed from at least one material of molybdenum, molybdenum-niobium alloy, aluminum, aluminum-neodymium alloy, titanium and copper.

10. A display device, comprising the display panel according to claim 1.

11. A method for repairing a disconnected line of a display panel, the display panel comprising:
a lower substrate comprising data lines;
a repair circuit comprising a proximal repair circuit, a distal repair circuit and an amplifier circuit;
wherein an input terminal of the amplifier circuit is configured to electrically connect to a signal input terminal of a disconnected data line, and an output terminal of the amplifier circuit is configured to electrically connect to a terminal of the proximal repair circuit and a terminal of the distal repair circuit respectively;
another terminal of the proximal repair circuit is configured to connect to a terminal of the disconnected data line that is close to the signal input terminal of the disconnected data line; and
another terminal of the distal repair circuit is configured to connect to a terminal of the disconnected data line that is away from the signal input terminal of the disconnected data line;
the method comprising:
cutting off a signal input terminal of a disconnected data line;
electrically connecting the input terminal of the amplifier circuit to the signal input terminal of the disconnected data line;
electrically connecting the output terminal of the amplifier circuit to a terminal of the proximal repair circuit and a terminal of the distal repair circuit respectively;
electrically connecting another terminal of the proximal repair circuit to a terminal of the disconnected data line that is close to the signal input terminal of the disconnected data line; and
electrically connecting another terminal of the distal repair circuit to a terminal of the disconnected data line that is away from the signal input terminal.

12. The method according to claim 11, wherein the amplifier circuit comprises an operational amplifier, a first repair line and a first trace line; the proximal repair circuit comprises a second repair line and a second trace line; the distal repair circuit comprises a third trace line; the data lines are intercrossed with and insulated from the first repair line and the second repair line;
a terminal of the first trace line is connected to an input terminal of the operational amplifier, and another terminal of the first trace line is disposed close to the first repair line; a terminal of the second trace line is connected to an output terminal of the operational amplifier, and another terminal of the second trace line is disposed close to the second repair line; a terminal of the third trace line is connected to the output terminal of the operational amplifier, and another terminal of the third trace line is disposed close to terminals of all the data lines that are away from the signal input terminals of all the data lines.

13. The method according to claim 12, wherein the disconnected data line is cut off through a laser cutting process at a cutting location located between the first repair line and the second repair line; and the method further comprises:
connecting the other terminal of the first trace line to the first repair line through a laser welding process;
connecting the other terminal of the second trace line to the second repair line;
connecting the other terminal of the third trace line to a terminal of the disconnected data line that is away from the signal input terminal of the disconnected data line;
connecting the first repair line to the disconnected data line;
connecting the second repair line to the disconnected data line.

14. The method according to claim 13, further comprising:
cutting off the first repair line through the laser cutting process, wherein a cutting location of the first repair line is located between the disconnected data line and a data line adjacent to the disconnected data line, and is located on a side of a junction of the disconnected data line and the first repair line that is farther away from the first trace line.

15. The method according to claim 13, further comprising:
cutting off the second repair line through the laser cutting process, wherein a cutting location of the second repair line is located between the disconnected data line and a data line adjacent to the disconnected data line, and is located on a side of a junction of the disconnected data line and the second repair line that is farther away from the second trace line.

16. The method according to claim 13, wherein the disconnected data line is cut off by a laser repair device.

17. The method according to claim 13, wherein the other terminal of the first trace line and the first repair line are connected by a laser repair device.

18. The display panel according to claim 1, wherein the lower substrate comprises: an effective display area and a peripheral wiring area;
the data lines are disposed in the effective display area and extend to the peripheral wiring area; and the repair circuit is disposed in the peripheral wiring area.

* * * * *